United States Patent
Mitsuishi

Patent Number: 6,031,366
Date of Patent: Feb. 29, 2000

[54] VARIABLE CURRENT SOURCE WITH DEVIATION COMPENSATION

[75] Inventor: Masafumi Mitsuishi, Tokyo, Japan

[73] Assignee: NEC Corporation, Japan

[21] Appl. No.: 09/136,382

[22] Filed: Aug. 19, 1998

[30] Foreign Application Priority Data

Aug. 21, 1997 [JP] Japan ................................ 9-224947

[51] Int. Cl.[7] .............................. G05F 3/16; H03M 1/80
[52] U.S. Cl. ......................... 323/315; 323/313; 341/153
[58] Field of Search ................................ 323/312, 313, 323/314, 315; 341/153; 327/530

[56] References Cited

U.S. PATENT DOCUMENTS

| | | | |
|---|---|---|---|
| 4,859,930 | 8/1989 | Schouwenaars et al. | 323/317 |
| 5,608,348 | 3/1997 | Kearney et al. | 327/538 |
| 5,619,122 | 4/1997 | Kearney et al. | 323/312 |
| 5,668,550 | 9/1997 | Coleman, Jr. | 341/119 |
| 5,854,563 | 12/1998 | Oh et al. | 327/74 |

FOREIGN PATENT DOCUMENTS

| | | | |
|---|---|---|---|
| 61-114319 | 6/1986 | Japan | G05F 1/56 |
| 4-42619 | 2/1992 | Japan | H03M 1/74 |

*Primary Examiner*—Peter S. Wong
*Assistant Examiner*—Bao Q. Vu
*Attorney, Agent, or Firm*—Ostrolenk, Faber, Gerb & Soffen, LLP

[57] ABSTRACT

A variable current source using weighted current sources for preventing degradation of an accuracy of an output current due to deviations in manufacturing. The variable current source is formed by a series of binary weighted current sources having a first current source of the lowest order on a lower side with a current value equal to or lower than a tolerance current value which is a resolution for an output current. Assuming that e is a deviation rate of the variations due to manufacturing, a current value $Ia_k$ of a $k^{th}$ current source in current value increasing order is derived by adding a deviation to a designed current value of the current source. The current value is set to be equal to or lower than a sum of a higher deviation current value, derived by adding a deviation to a designed current value of a current source below the $k^{th}$ current source immediately and a lower deviation current value, derived by subtracting the deviation from the designed value of the $k-1^{th}$ current source, expressed by the following:

$$Ia_k \leq Ia_{(k-1)} + Ic_{(k-1)}$$

and $Ia_k$ is a value less than a sum of a total of all lower deviation current values from the first current source to the current source arranged immediately adjacent on the lower side and the tolerance current value, expressed by the following:

$$Ia_k \leq Ic_1 + Ic_2 + \ldots + Ic_{(k-1)} + a_1$$

and the output current has overlapped portions to absorb an error due to deviations.

21 Claims, 5 Drawing Sheets

INCLINATION ERROR LESS

| k | 1 | 2 | ...... | n |
|---|---|---|---|---|
| $Ia_k = (1 + e_k)Ib_k$ | $Ia_1$ | $Ia_2$ | ...... | $Ia_n$ |
| $Ib_k$ | $Ib_1$ | $Ib_2$ | ...... | $Ib_n$ |
| $Ic_k = (1 - e_k)Ib_k$ | $Ic_1$ | $Ic_2$ | ...... | $Ic_n$ |

$e_k$: DEVIATION

| k | 1 | 2 | 3 | 4 | 5 |
|---|---|---|---|---|---|
| $Ia_k = (1 + e)Ib$ | 0.11 | 0.198 | 0.352 | 0.638 | 1.115 |
| $Ib_k$ | 0.1 | 0.18 | 0.32 | 0.58 | 1.05 |
| $Ic_k = (1 - e_k)Ib_k$ | 0.09 | 0.162 | 0.288 | 0.522 | 0.945 |

| 6 | 7 | 8 | 9 | 10 |
|---|---|---|---|---|
| 2.09 | 3.795 | 6.897 | 12.54 | 22.792 |
| 1.90 | 3.45 | 6.27 | 11.40 | 20.72 |
| 1.71 | 3.105 | 5.643 | 10.26 | 18.648 |

DEVIATION : $\pm e_k = \pm 10\%$

: [μA]

| k | 1 | 2 | 3 | 4 | 5 |
|---|---|---|---|---|---|
| $Ib_k$ | 0.11 | 0.22 | 0.44 | 0.88 | 1.76 |
| $Id_k$ | 0.11 | 0.2222 | 0.4488 | 0.9064 | 1.8304 |

| 6 | 7 | 8 |
|---|---|---|
| 3.52 | 7.04 | 14.08 |
| 3.696 | 7.4624 | 15.0656 |

$$Id8 - \sum_{k=1}^{7} Id_k = 0.3894 \ [\mu A]$$

DEVIATION : $\pm e_k = 0$

VARIABLE CURRENT SOURCE WITH DEVIATION COMPENSATION

BACKGROUND OF THE INVENTION

1. Field of the Invention

The present invention relates to a variable current source, and more particularly to a variable current source with a small area and a high accuracy using MOS transistors.

2. Description of Related Arts

Conventionally, a variable current source circuit of this type is used for switching MOS current sources connected in parallel as weighted current sources for a DA converter. This is done to obtain a current value as an analogue output signal by adding and subtracting the individual currents by switching digital input signals, for example, as described in Japanese Patent Application laid-open No.4-42619.

FIG. 1 is a circuit diagram showing the above-mentioned known example and illustrates a six-bit DA converter. In this example, the lower two bits are composed of weighted current sources $T_1$, $T_2$ and the upper four bits are composed of segment current sources $I_1$ to $I_{15}$. Each of the current sources $T_1$, $T_2$ and $I_1$ to $I_{15}$ is composed of a single or a plurality of unit current sources $t_1$ connected in parallel and serving as the minimum resolution. Assuming that a current value of $t_1$ is $It_1$, and current values of $T_1$, $T_2$ and $I_1$ to $I_{15}$ are $IT_1$, $IT_2$, and $II_1$ to $II_{15}$, respectively, the following is defined:

$$IT_1 = 1 \cdot It_1 \tag{1}$$

$$IT_2 = 2 \cdot It_1 \tag{2}$$

$$II_1 \sim II_{15} = 4 \cdot It_1 \tag{3}$$

Each of current sources $T_1$, $T_2$, and $I_1$ to $I_{15}$ is connected to node $N_2$ through switches $ST_1$, $ST_2$, and $SI_1$ to $SI_{15}$.

The operation of the circuit is described herein. Switches $ST_1$, $ST_2$, and $SI_1$ to $SI_{15}$ are turned on and off by digital input signals to sum the switched current values based on the values shown in equations (1) through (3) for output to node $N_2$. For example, $5 \cdot It_1$ represents that switches $ST_1$ and $SI_1$ turn on, i.e. $II_1 + IT_1 = 5 \cdot It_1$, while $11 \cdot It_1$ represents that switches $ST_1$, $ST_2$, $SI_1$, and $SI_2$ turn on, i.e. $II_1 + II_2 + IT_1 + IT_2 = 11 \cdot It_1$. In this manner, an analogue current value can be generated in a range from zero to $63 \cdot It_1$.

FIG. 2 is a layout diagram of the circuit shown in the above-mentioned known example and illustrates a layout when a binary weighted current source formed of $T_1$, $T_2$ shown in FIG. 1 is extended to compose a binary weighted current source of four bits. The binary weighting is performed by using a single or a plurality of unit current sources $t_1$ serving as the minimum resolution.

The above-mentioned variable current source in the prior art, however, has a disadvantage as described below.

Important characteristics when considering a variable current source are a variable amount for a total output current and a tolerance error current value for the output current. Specifically, when a current source is to be made, for example, with a current variable of 28.05 μA and a tolerance error current value of less than or equal to 0.11 μA, such a current source may be made with a minimum current source of equal to or lower than 0.11 μA. This example will be described more specifically for each scheme of the prior art.

When a current source is to be made in a segment circuit scheme, for example, with a current variable amount of 28.05 μA and a tolerance current value of 0.11 μA, a desired variable current source can be obtained by setting a unit segment current value to 0.11 μA and connecting 255 each of such unit segment circuits in parallel. This segment circuit scheme has an advantage that the tolerance error current value for an output current is hardly degraded even when respective current values of the 255 unit segment currents are deviated due to an error in manufacturing. This scheme, however, has a disadvantage that 255 switches are required to switch the connection of 255 current sources to thereby increase the size of a circuit and the area thereof.

When a current source is similarly to be made in a weighted circuit scheme with a current variable of 28.05 μA and a tolerance current value of 0.11 μA, a desired variable current source can be obtained by connecting in parallel eight current sources which have current values ranging from a minimum of 0.11 μA and a multiple of two thereof (a binary series) sequentially up to 14.08 μA, i.e. eight current sources with current values of 0.11 μA, 0.22 μA, 0.44 μA, 0.88 μA, 1.76 μA, 3.52 μA, 7.04 μA, and 14.08 μA. In this case, switches for switching the connection of the a current sources may be not more than eight to reduce the size of a circuit. The above-mentioned scheme, however, has a disadvantage that the tolerance current value for an output current is degraded when respective current values of the eight current sources are deviated due to manufacturing. Specifically, when a random error and an inclination error on a wafer are considered in manufacturing, the random error does not become a factor to degrade the tolerance current value if a layout of the circuit is improved, for example, by using a segment current source to compose all weighted current sources as the known example shown in FIG. 2. However, in spite of such an improvement, the tolerance current value is degraded when the inclination error occurs as shown in FIG. 2. When the above-mentioned eight bit weighted current source is considered in which the inclination error becomes greater by 1% as the weighted current source proceeds to the higher order, respective currents take values as shown in FIG. 8. In this case, the total current value of the lower seven current sources is 14.6762 μA, while the current value of a current source in the most highest order is 15.0656 μA. A difference in the amount between the two current values is derived as follows:

$$15.0656 - 14.6762 = 0.3894 (\mu A) \tag{4}$$

The derived value is above the tolerance error current value of 0.11 μA. The value is converted to a resolution as follows:

$$\log_2[\{(15.0656+14.6762)/0.3894\}+1] \approx 6.27 \text{(bit)} \tag{5}$$

The derived value is one substantially degraded as compared with an accuracy for an eight bit binary weighted current source.

The layout can be improved to reduce an effect of the inclination error on the resolution in a weighted circuit. In such a case, however, it is required to arrange a plurality of weighted circuits at different angles to connect respective current sources such that the inclination error is canceled, which causes a disadvantage in the form of a complicated layout and an increased area.

SUMMARY OF THE INVENTION

It is an object of the present invention to provide a variable current source circuit with a simple structure and a compact size, which is capable of avoiding a complicated configuration and an increased size as mentioned above.

The variable current source circuit according to the present invention is arranged to cause no degradation of a resolution for an output current, i.e. a tolerance current value, even when deviations occur in current values of current sources in a weighted circuit, by designing the current values of the respective current sources in consideration of deviations of the current values due to manufacturing. Also, the variable current source circuit according to the present invention is arranged to minimize the number and the area of the current sources to achieve an optimal design by defining current design values for the respective current sources by regularizing against the deviations.

Additionally, while the prior art binary weighted variable current source is designed to uniformly increase an output current by adding a constant value corresponding to an increase of a digital input signal monotonously, the variable current source according to the present invention is arranged to regularly decrease an added value to the output current corresponding to the increase of the digital input signal. The present invention further increases the output current by adding a value equal to or lower than the tolerance current value to a sum of the lower side deviation current values of the current sources within a descending order to a first current source.

In accordance with the above-mentioned concept, the variable current source circuit according to the present invention includes a plurality of weighted current sources having different fixed current values respectively, and is characterized in that the tolerance current value equal to the resolution of the output current is a current value of a first current source. A current value of each current source is increased by adding a value equal to or lower than the tolerance current value to a sum of current values of current sources within a descending order to the first current source.

It is a preferred embodiment that the variable current source comprises a series of current sources arranged in an ascending order. Each current source is designed to supply a capacity of current multiplying the current value of current source at an immediately descending order binary series sequentially from the first current source. Each current source further has a higher side deviation current value derived by adding a deviation due to manufacturing to the designed supply capacity of current which is equal to or lower than a sum of a higher side deviation current value of a current source at the immediately descending order. Each current source has a lower side deviation current value derived by subtracting the deviation from the designed supply capacity of current. Also, each of the current sources for outputting a constant current may have a MOS transistor having a gate connected to a power supply $V_{dd}$ on a higher potential side and have a connection for operating the transistor in a non-saturated region.

It is also preferable that the current values of the current sources increase multiplying by binary series sequentially in current value increasing ascending order basically, and the actual increment of each current source is lower than the tolerance current value, the value being regularly decreased in current value ascending order.

Additionally, the current value of each current source may be equal to or lower than a value derived by dividing a double designed value of the current source at the immediately descending order by a deviation rate plus one in the current source.

The number k of the current sources which compose a variable current source is derived as a least value which makes a sum of a geometric progression greater than variable amount $I_{max}$ where the geometric progression whose common ratio is r and first term is a is derived by subtracting the deviation from tolerance current, that is the k is derived by the equation:

$$a \cdot (r^k - 1)/(r-1) \geq I_{max}$$

$$k \geq \log\{1 + (r-1) \cdot I_{max}/a\}/\log r$$

where r is a common ratio equal to a quotient calculated by dividing 2 by the tolerance error current value.

DESCRIPTION OF THE PREFERRED EMBODIMENT

Figure 1:
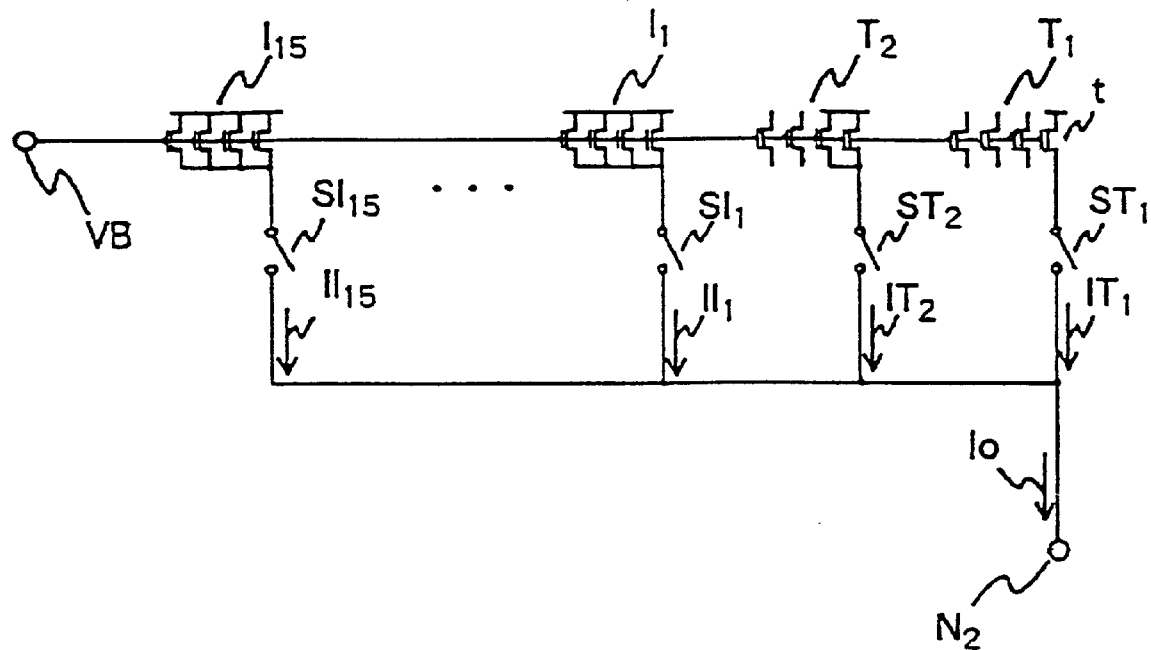
FIG. 1 is a circuit diagram illustrating a prior art embodiment.
Figure 2:
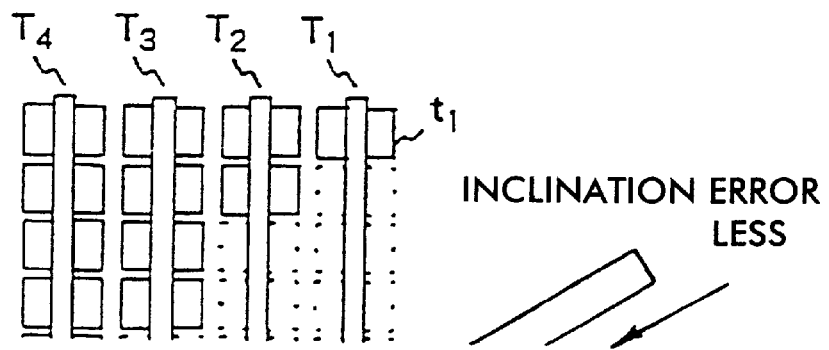
FIG. 2 is a diagram illustrating a layout of a prior art binary weighted circuit.
Figures 3, 4:
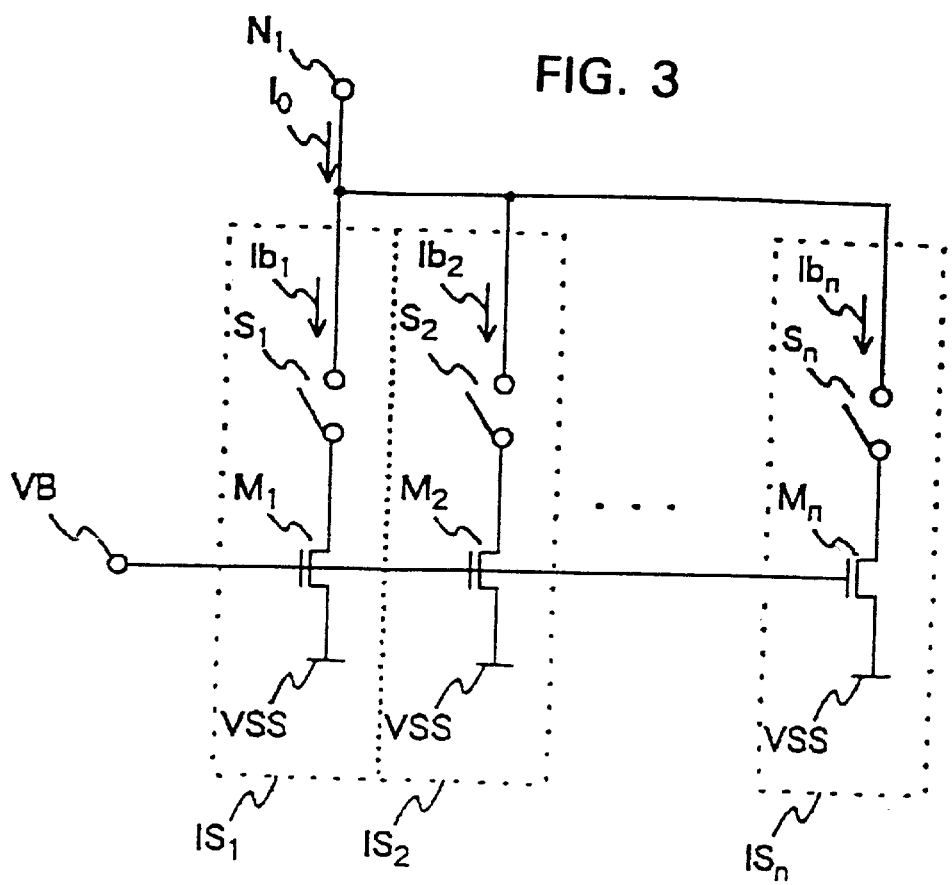
FIG. 3 is a circuit diagram illustrating an embodiment according to the present invention.
FIG. 4 is a table showing current design values of the circuit shown in FIG. 3 and equations therefor.

FIG. 3 shows a first embodiment of the present invention. First, the configuration thereof is described. The embodiment includes a weighted variable current source circuit including current sources $IS_1$ to $IS_n$ composed of a plurality of transistors $M_1$ to $M_n$ connected in parallel, each of which has a gate connected to bias voltage VB, a source connected to power supply $V_{ss}$, and a drain connected to node $N_1$ through switches $S_1$ through $S_n$. A digital signal is inputted to switches $S_1$ to $S_n$ of the variable current sources circuit and variable current $I_o$ is outputted from node $N_1$.

Next, the operation of the circuit is described. Switches $S_1$ to $S_n$ are turned on and off by the digital input signal. Respective transistors $M_1$ to $M_n$ serve as constant current source with current design values of $Ib_1$ to $Ib_n$, and an arbitrary total value of $Ib_1$ to $Ib_n$ is outputted as variable current $I_o$ from node $N_1$ with the connection switching by switches $S_1$ to $S_n$.

As shown in FIG. 4, the variable current source circuit shown in FIG. 3 is characterized by the design values $Ib_1$ to $Ib_n$, in which the variable current source circuit is designed to cause no degradation of a resolution for $I_o$, i.e. a tolerance error current value even when current values are deviated from design values $Ib_1$ to $Ib_n$. A more specific description is as follows.

Assuming that the tolerance error current value for output current $I_o$, i.e. an allowable maximum step amount for a current change is $a_1$. For current value $Ib_k$ of k th current source $IS_k$, current sources on $IS_1$ side are referred to as current sources with small currents, i.e. current sources on the lower side, and a maximum value of $Ib_k$ resulting from deviations is $Ia_k$, and a minimum value of $Ib_k$ is $Ic_k$. Here, assuming that a deviation rate is ±e, the following is expressed for $IS_k$.

$$Ic_k = (1-e_k) \cdot Ib_k \quad (6)$$

$$Ia_k = (1+e_k) \cdot Ib_k \quad (7)$$

A case is considered where switches $S_1$ to $S_n$ are all turned off and output current $I_o$ is gradually increased from zero. First, when switch $S_1$ is turned on from off, a change amount in the current is a maximum of $Ia_1$ since $IS_1$ can take the current value of a maximum of $Ia_1$. $Ia_1$ needs to be within the tolerance error, so that it is required to satisfy the following:

$$Ia_1 \leq a_1 \tag{8}$$

Where $a_1$ is a tolerance current value. Next, when a digital input signal is increased by one, switch $S_2$ is turned on and switch $S_1$ is turned off, a change amount in the current is at the maximum when the current value of $IS_1$ is deviated to the minimum value of $Ic_1$ and the current value of $IS_2$ is deviated to the maximum value of $Ia_2$. Therefore, it is required to satisfy the following:

$$Ia_2 - Ic_1 \leq a_1 \tag{9}$$

Since the right-hand member in equation (9) is equal to the right-hand member in equation (8), equation (9) is satisfied by setting $Ia_2$ so as to satisfy the following:

$$Ia_2 \leq Ic_1 + Ia_1 \tag{10}$$

Next, when the digital input signal is further increased by one, and switch $S_2$ is turned on and switch $S_1$ is turned on from the state that switch $S_2$ is on and switch $S_1$ is off, the current amount is changed only by an increase in the current value with $IS_1$, so that only equation (8) needs to be satisfied. Next, when the digital input signal is further increased by one, and switch $S_3$ is turned on, switch $S_2$ is turned off, and switch $S_1$ is turned off from the state that switch $S_3$ is off, switch $S_2$ is on, and switch $S_1$ is on, a change amount in the current is at the maximum when $IS_3$ is deviated to the maximum value of $Ia_3$, $IS_2$ is deviated to the minimum value of $Ic_2$, and $IS_1$ is deviated to the minimum value of $Ic_1$, so that it is required to satisfy the following:

$$Ia_3 - Ic_2 - Ic_1 \leq a_1 \tag{11}$$

From equation (8), equation (11) is satisfied as long as the following is satisfied:

$$Ia_3 \leq Ic_2 + (Ic_1 + Ia_1) \tag{12}$$

The second term in the right-hand member in equation (12) is equal to the right-hand member in equation (10). Therefore, equation (12) is satisfied by setting $Ia_3$ so as to satisfy the following:

$$Ia_3 \leq Ic_2 + Ia_2 \tag{13}$$

Similarly for $Ia_4$, the following is derived:

$$Ia_4 - Ic_3 - Ic_2 - Ic_1 \leq a_1 \tag{14}$$

From equations (8) and (12), equation (14) is satisfied as long as the following is satisfied:

$$Ia_4 \leq Ic_3 + Ia_3 \tag{15}$$

By repeating the above, the following is derived:

$$Ia_k \leq Ic_{(k-1)} + Ia_{(k-1)} \tag{16}$$

When equations (6) and (7) are substituted into equation (16), the followings are derived:

$$Ia_k \leq \{2/(1+e_{(k-1)})\} \cdot Ia_{(k-1)} \tag{17}$$

$$Ib_k \leq \{2/(1+e_k)\} \cdot Ib_{(k-1)} \tag{18}$$

From the above, $Ia_k$ is set so as to satisfy the followings:

when $k=1$, $Ia_1 \leq a_1$ \hfill (19)

when $k \geq 2$, $Ia_k \leq Ic_{(k-1)} + Ia_{(k-1)}$ \hfill (20)

or $Ia_k \leq \{2/(1+e_{(k-1)})\} \cdot Ia_{(k-1)}$ \hfill (21)

Alternatively, $Ib_k$ is set so as to satisfy the followings:

when $k=1$, $Ib_1 \leq a_1/(1+e_1)$ \hfill (22)

when $k \geq 2$, $Ib_k \leq \{2/(1+e_k)\} \cdot Ib_{(k-1)}$ \hfill (23)

Thus, even when the respective current values in the weighted current source circuit are deviated from the design values, the tolerance current value for output current $I_o$ of the variable current source is not above $a_1$, so that the variable current source can be made without degradation of the resolution for output current $I_o$.

The current value of each current source is set such that $Ia_k$ shown in equations (19), (20), (21) or $Ib_k$ shown in equations (22), (23) takes an upper limit value represented by equality signs, which can minimize the number of the current sources and perform an optimal design.

Additionally, each current value can be set in accordance with equations (19), (20), (21), or equations (22), (23) to eliminate an influence of an error due to the deviations, so that it is not required to take measures such as an increased size for reducing the deviations as is the case with the prior art. Thus, the size of the circuit and the area thereof can be substantially reduced. Furthermore, since transistors $M_1$ to $M_n$ not need to be uniform in shape, transistors with different channel lengths can be freely combined for use, for example, channel length L is extended to make a current source on the lower side with a small current value. When a channel width of the transistor is extended, a transistor can be used with a gate of a folded shape.

Figures 5, 6:
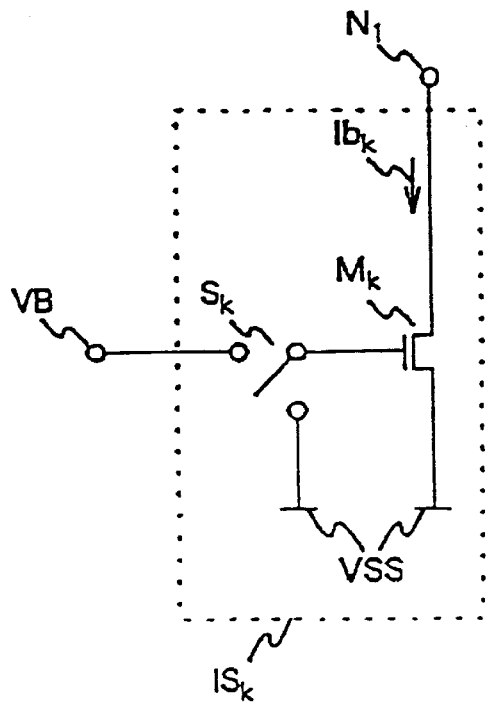
FIG. 5 is a circuit diagram illustrating another embodiment of the weighted current source shown in FIG. 3.
FIG. 6 is a table illustrating a specific embodiment according to the present invention.

Each weighted current source $Is_k$ may be of any configuration as long as an output of current $Ib_k$ to output node $N_1$ is controlled by switching switch $S_k$ with a digital input signal. Thus, as shown in FIG. 5, the circuit can be composed by using transistor $M_k$ having a gate connected to bias voltage VB through switch $S_k$, a source connected to power supply VSS and a drain connected to node $N_1$.

Incidentally, when no deviations occur in equation (23), i.e. deviation rate $\pm e_k$ is equal to zero, the following is derived:

$$Ib_k \leq 2 \cdot Ib_{(k-1)} \tag{24}$$

When the value is set with an upper limit value, i.e. a value represented by an equality sign, a conventional binary weighted current source circuit is obtained, in which a current source in the higher order has a current value being double the current value of a current source at the immediately descending order.

In addition, although the circuits shown in FIG. 3 and FIG. 5 are composed such that a gate voltage of each weighted current source is connected to bias voltage VB, it is possible to provide a power supply VDD on a higher potential side to be connected instead of bias voltage VB to use transistors $M_1$ to $M_n$ in a non-saturated region, which results in a variable resistance circuit capable of preventing an accuracy degradation due to variations in manufacturing.

Another embodiment of the present invention will now be described.

FIG. 6 shows a table of specific numerical values for respective current values shown in FIG. 4. By way of example, when a deviation rate of each current source is ±10%, a tolerance error current value is 0.11 $\mu$A, and a current variable is equal to or higher than 28.05 $\mu$A, i.e. the following is assumed:

$$e_k=10\%, a_1=0.11 \mu A \tag{25}$$

from equation (22), an upper limit value of $Ib_1$ is derived as follows:

$$Ib_1=0.1 \mu A \tag{26}$$

Also, from equation (23), the following is derived:

$$Ib_k \leq \{2/1.1\} \times Ib_{(k-1)} \tag{27}$$

Therefore, from equations (26) and (27), the following is derived:

$$Ib_2 \leq \{2/1.1\} \times 0.1 \mu A \approx 0.1818 \tag{28}$$

For example, the value derived in equation (28) is rounded down below the third decimal place to design as follows:

$$Ib_2=0.18 \mu A \tag{29}$$

Similarly calculating for $Ib_3$ onward results in values shown in FIG. 6. A total of ten current sources can be used to achieve the current variable amount equal to or higher than 28.05 $\mu$A. In the case of FIG. 6, the value is rounded down below the third decimal place for calculation.

As the rounded value is increased, the output current is become more unaffected by the deviations. On the other hand, more current sources are required.

The optimal number of the current sources is derived by calculating equation (27) with an equality sign without the inequality sign.

Specifically, for $Ib_k$, a geometric progression of common ratio r=2/1.1 and first term a=$Ib_1$=0.1 $\mu$A is considered, and a minimum value of k shall be derived such that a sum of the geometric progression is equal to or higher than current variable $I_{max}$=28.05 $\mu$A. Therefore, the following is derived:

$$a \cdot \{(r^k-1)/(r-1)\} \geq I_{max} \tag{30}$$

Equation (30) is modified to derive the following:

$$r^k \geq 1+(r-1)I_{max}/a \tag{31}$$

Equation (31) is further modified to derive the following:

$$k \geq \log \{1+(r-1) \cdot I_{max}/a\}/\log(a) \tag{32}$$

The values are substituted into equation (32) to derive the following:

$$k \geq 9.0998 \tag{33}$$

Thus, it is shown that at least ten current sources are required.

Although the current value is rounded to enter into the table in FIG. 6, the number of the current sources derived is ten, so that it is shown that the rounded down current value does not lead to increase in the number of the current sources in this case.

Moreover, a variable current source, which satisfies the condition shown in equation (25) and has a current variable of approximately 45.97 $\mu$A at design value, can be obtained in the variable current source shown in FIG. 6.

Figures 7, 8:
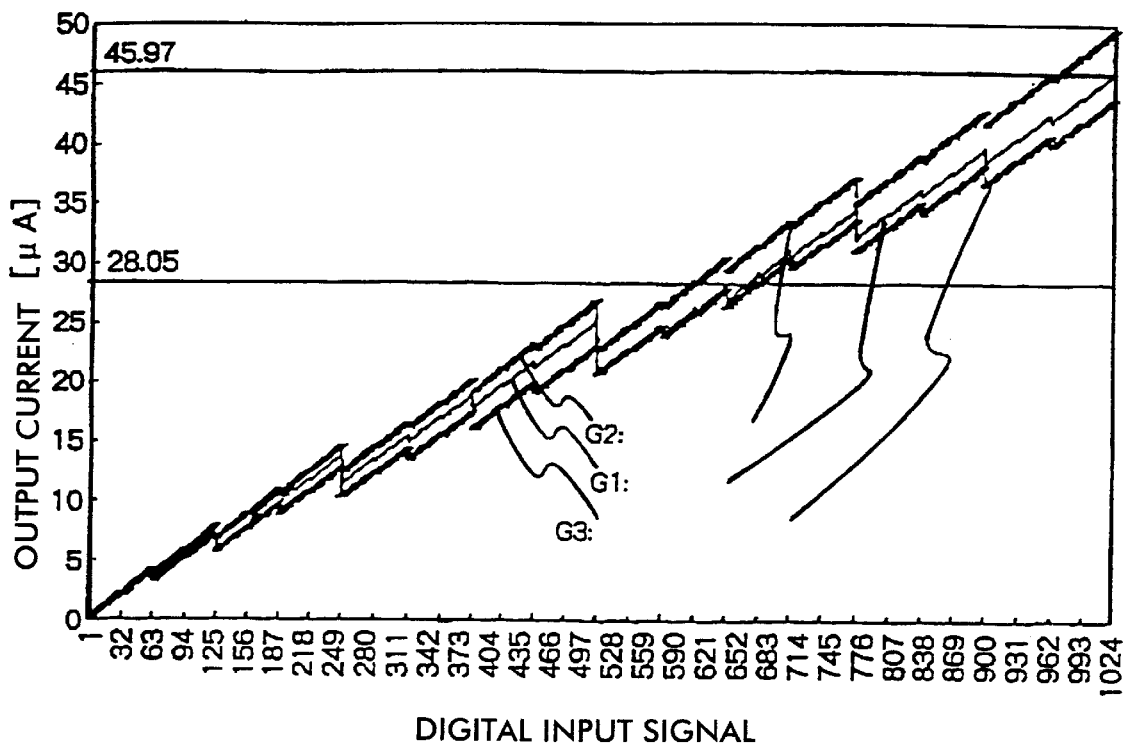
FIG. 7 is a graph illustrating characteristics of input and output in the embodiment shown in FIG. 6.
FIG. 8 is a table illustrating a specific embodiment of a prior art.

FIG. 7 shows a graph representing a characteristic of output current $I_o$ corresponding to the digital input signal in the variable current source shown in FIG. 6. G1 represents a characteristic for design value $Ib_k$. As is apparent from the graph, output current $I_o$ is designed to slightly overlap at switching points for the respective current sources.

Thus, output current $I_o$ can be outputted within the tolerance error current value in a range of the variable current even when the current value of the current source is randomly deviated.

G2 represents a characteristic when the inclination error exists such that the current value of the current source is increased by 1% as the current source proceeds to the higher order.

In this case, output current $I_o$ is also continuously generated in the range of the variable current. G3 represents a characteristic when the current values of the 7th, 8th, and 9th current sources are changed by −10% respectively, and output current $I_o$ is continuously generated similarly in this case.

FIG. 8 shows a table when the same circuit as the conventional binary weighted current source circuit shown in FIG. 6 is used for comparison, i.e. when a tolerance error current value is 0.11 $\mu$A, and a current variable is 28.05 $\mu$A.

In this case, eight current sources can be used to obtain the current variable of 28.05 $\mu$A. Although the number of the current sources is less than that shown in FIG. 6, when any of eight current sources exerts a value off the design value, then there is generated a point where a desired output current $I_o$ is not obtained within the tolerance error current value. An illustrative description is made with reference to FIG. 9.

Figure 9:
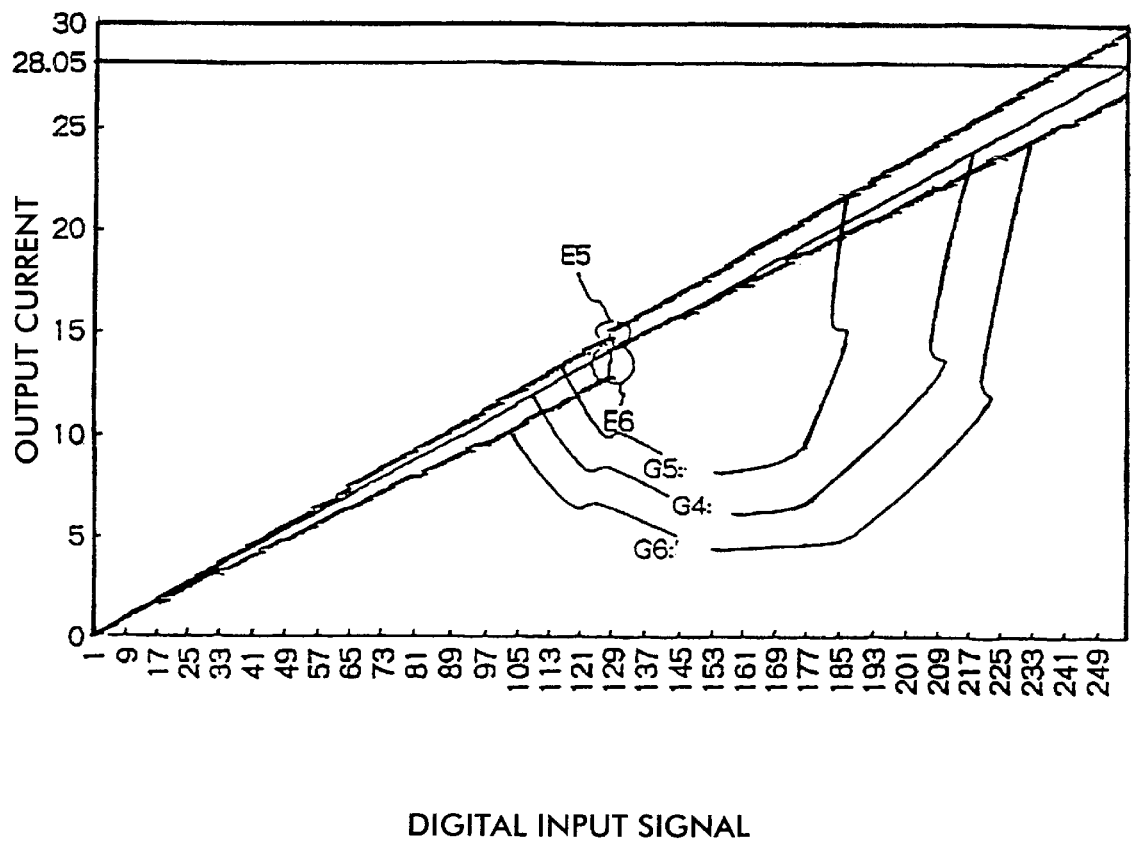
FIG. 9 is a graph illustrating characteristics of input and output in the embodiment shown in FIG. 8.

FIG. 9 shows a graph representing a characteristic of output current $I_o$ with regard to a digital input signal in the conventional binary weighted current source circuit shown in FIG. 8.

Similar to FIG. 7, G4 represents a characteristic for a design value, G5 represents a characteristic when the inclination error is 1%, and G6 represents a characteristic when the current values of the 5th, 6th, and 7th current sources are deviated by −10%.

As is apparent from the graph, the circuit is designed to accurately output the current variable at an interval of the tolerance error current value: 0.11 $\mu$A as G4.

Thus, there is generated discontinuous points E5 and E6 where a desired output current $I_o$ is not obtained within the tolerance error current value as in G5 and G6 when an error occurs due to deviations.

As described above, a level conversion circuit according to the present invention has an effect that the current value of each current source is designed in consideration of the deviations of the current values due to an error in manufacturing in the current sources of the weighted circuit, so that no deterioration is generated in the resolution of the output current, i.e. the tolerance error current value when the deviations are present.

Also, the level conversion circuit according to the present invention has an effect that the current design value of each current source is defined by equations to the deviations to thereby minimize the number and the area of the current sources and achieve an optimal design.

What is claimed is:

1. A variable current source circuit comprising:

a sequence of current sources of increasing current value including a first current source and at least one additional current source, each current source having different fixed current values along with a deviation respectively, wherein said first current source has a lowest current value and generates a fixed current value less than a predetermined tolerance current value, said predetermined tolerance current value being equal to a resolution for an output current, each of said additional current sources generating a respective designed current value which is approximately equal to twice the current value of an immediately preceding current source in said sequence, and an allowable higher side deviation current value of each additional current source, measured by adding said deviation to said respective designed current value of each of said current sources, is equal to or less than a sum of a higher side deviation current value of the immediately preceding current source in said sequence and a lower side deviation current value of the immediately preceding current source in said sequence, said lower side deviation current value being derived by subtracting said deviation from the respective designed current value.

2. A variable current source circuit comprising:

sequence of current sources of increasing current value including a first current source and at least one additional current source, each current source having different fixed current values along with a deviation respectively, wherein said first current source has a lowest current value and generates a fixed current value less than a predetermined tolerance current value, said predetermined tolerance current value being equal to a resolution for an output current, said current sources supply respective designed current values with each additional current source having a current value which is approximately double the current value of the immediately preceding current source in said sequence, each additional current source has a higher side deviation current value which is derived by adding said deviation to the corresponding designed current value and a higher side deviation current value of each additional current source is equal to or less than a sum of said predetermined tolerance current value and all lower side deviation current values of all current sources having a lower designed current value, each of said lower side deviation current values being derived by subtracting said deviation from the respective designed current value.

3. A variable current source circuit comprising:

a sequence of current sources of increasing current value including a first current source and at least one additional current source, each current source having different fixed current values along with a deviation respectively, wherein each additional current source has a current value equal to or less than double the current value of an immediately preceding current source in said sequence, wherein a first current source has a lowest current value and generates a fixed current value less than a predetermined tolerance current value, said predetermined tolerance current value being equal to a resolution for an output current, each of said current sources comprises a MOS transistor which outputs a constant current and has a source and a gate, said gate being connected to a higher power supply which is at a higher potential than said source when said MOS is an NMOS transistor, said gate being connected to a lower power supply which is at a lower potential than said source when said MOS is a PMOS transistor, and having a connection for operating said MOS transistors in a non-saturated region.

4. A variable current source circuit comprising:

a sequence of current sources of increasing current value including a first current source and at least one additional current source, each current source having different fixed current values along with a deviation respectively; wherein each additional current source generates a respective designed current value equal to or less than double the current value of an immediately preceding current source in said sequence, said first current source has a lowest value and generates a fixed current value less than a predetermined tolerance current value, said predetermined tolerance current value being equal to a resolution for an output current, and the difference between current sources which are adjacent in value decreases as compared with the difference in value of corresponding terms in a binary series starting with a value equivalent to the value of said first current source and having the same number of terms as the number of current sources.

5. A variable current source circuit comprising:

a sequence of current sources on increasing current value including a first current source and at least one additional current source, each current source having different designed current values along with a deviation respectively, wherein each additional current source has a current value equal to or less than double the current value of an immediately preceding current source in said sequence, said first current source has a lowest value and generates a fixed current value less than a predetermined tolerance current value, said predetermined tolerance current value being equal to a resolution for an output current, and said designed current value of each additional current source is equal to or less than a value derived by dividing twice the designed current value of an immediately preceding current source in said sequence by a sum of said deviation and 1.

6. A variable current source circuit comprising:

a sequence of current sources of increasing current value including a first current source and at least one additional current source each current source, having different fixed current values along with a deviation respectively, wherein each additional current source has a current value equal to or less than double the current value of an immediately preceding current source in said sequence, said first current source has a lowest value and generates a fixed current value less than a predetermined tolerance current value, said predetermined tolerance current value being equal to a resolution for an output current, the number of said current sources k is calculated by the following equation:

$$k \geq \log\{1+(r-1)I_{max}/a\}/\log(r)$$

where r is a common ratio equal to a quotient calculated by dividing 2 by a sum of said deviation and 1, a is a value calculated by subtracting said deviation from said tolerance current value, and the minimum value of k yields a sum output of said current sources that is equal to or greater than a required maximum current $I_{max}$.

7. A variable current source circuit according to claim 1, wherein the number of said current sources k is calculated by the following equation:

$$k \geq \log\{1+(r-1)I_{max}/a\}/\log(r)$$

where r is a common ratio equal to a quotient calculated by dividing 2 by a sum of said deviation and 1, a is a value calculated by subtracting said deviation from said tolerance error current value, and the minimum value of k yields a sum output of said current sources that is equal to or greater than a required maximum current $I_{max}$.

8. A variable current source circuit according to claim 2, wherein the number of said current sources k is calculated by the following equation:

$$k \geq \log\{1+(r-1)I_{max}/a\}/\log(r)$$

where r is a common ratio equal to a quotient calculated by dividing 2 by a sum of said deviation and 1, a is a value calculated by subtracting said deviation from said tolerance error current value, and the minimum value of k yields a sum output of said current sources that is equal to or greater than a required maximum current $I_{max}$.

9. A variable current source circuit according to claim 3, wherein the number of said current sources k is calculated by the following equation:

$$k \geq \log\{1+(r-1)I_{max}/a\}/\log(r)$$

where r is a common ratio equal to a quotient calculated by dividing 2 by a sum of said deviation and 1, a is a value calculated by subtracting said deviation from said tolerance error current value, and the minimum value of k yields a sum output of said current sources that is equal to or greater than a required maximum current $I_{max}$.

10. A variable current source circuit according to claim 4, wherein the number of said current sources is equal to a minimum value k calculated by the following equation:

$$k \geq \log\{1+(r-1)I_{max}/a\}/\log(r)$$

where r is a common ratio equal to a quotient calculated by dividing 2 by a sum of said deviation and 1, a is a value calculated by subtracting said deviation from said tolerance error current value, and the minimum value of k yields a sum output of said current sources that is equal to or greater than a required maximum current $I_{max}$.

11. A variable current source circuit according to claim 5, wherein the number of said current sources is equal to a minimum value k calculated by the following equation:

$$k \geq \log\{1+(r-1)I_{max}/a\}/\log(r)$$

where r is a common ratio equal to a quotient calculated by dividing 2 by a sum of said deviation and 1, a is a value calculated by subtracting said deviation from said tolerance error current value, and the minimum value of k yields a sum output of said current sources that is equal to or greater than a required maximum current $I_{max}$.

12. The variable current source as claimed in claim 1 wherein said deviation is caused by manufacturing.

13. The variable current source as claimed in claim 2 wherein said deviation is caused by manufacturing.

14. The variable current source as claimed in claim 3 wherein said deviation is caused by manufacturing.

15. The variable current source as claimed in claim 4 wherein said deviation is caused by manufacturing.

16. The variable current source as claimed in claim 5 wherein said deviation is caused by manufacturing.

17. The variable current source as claimed in claim 6 wherein said deviation is caused by manufacturing.

18. A method of creating a variable current source, said method comprising:

providing a sequence of current sources of increasing current value including a first current source and at least one additional current source, each current source having different fixed designed current values along with a deviation respectively;

establishing said first current source with a first current source value which is less than a predetermined tolerance current value; and establishing each additional current source with an allowable higher side deviation current value, measured by adding said deviation to said respective designed current value of said current source, said allowable higher side deviation current value being equal to or less than a sum of a higher side deviation current value of the immediately preceding current source in said sequence and a lower side deviation current value of the immediately preceding current source in said sequence, said lower side deviation current value being derived by subtracting said deviation from the respective designed current value.

19. The method as claimed in claim 18 wherein each additional current source further has current source value which is less than a sum of said predetermined tolerance current value and all lower side deviation current values of all current sources having a lower designed current value, each of said lower side deviation current values being derived by subtracting said deviation from each respective designed current value.

20. The method as claimed in claim 18 further comprising:

calculating a binary series, starting with a value equal to said first current source value, up to a kth term; and establishing a kth current source value which is less than said kth term of said binary series.

21. A method of creating a variable current source having a deviation, said method comprising:

providing a sequence of current sources of increasing current value including a first current source and at least one additional current source, each current source having different fixed current values along with a deviation respectively;

establishing said first current source with a first current source value which is less than a predetermined tolerance current value;

calculating a binary series, starting with a value equal to said first current source value, up to a kth term; and establishing a kth current source value which is less than a value of said kth term in said binary series.

* * * * *